(12) United States Patent
Hassonjee et al.

(10) Patent No.: US 8,709,185 B2
(45) Date of Patent: *Apr. 29, 2014

(54) FUNCTIONAL TEXTILE STRUCTURES

(75) Inventors: Qaizar N. Hassonjee, Chadds Ford, PA (US); Stacey B. Burr, Wilmington, DE (US)

(73) Assignee: Textronics, Inc., Chadds Ford, PA (US)

( * ) Notice: Subject to any disclaimer, the term of this patent is extended or adjusted under 35 U.S.C. 154(b) by 873 days.

This patent is subject to a terminal disclaimer.

(21) Appl. No.: 12/345,711

(22) Filed: Dec. 30, 2008

(65) Prior Publication Data

US 2009/0120560 A1 May 14, 2009

Related U.S. Application Data

(62) Division of application No. 11/570,310, filed as application No. PCT/IB2005/001679 on Jun. 15, 2005, now Pat. No. 7,902,095.

(60) Provisional application No. 60/581,048, filed on Jun. 18, 2004.

(51) Int. Cl.
*B32B 5/02* (2006.01)

(52) U.S. Cl.
USPC .......................................... 156/179; 156/226

(58) Field of Classification Search
USPC .......... 156/229, 66, 92, 93, 196, 227, 244.18, 156/252, 46, 176, 178, 179, 226; 428/12, 428/59, 92, 93, 122–123, 131–137, 139, 428/175, 182–184, 185, 193, 221, 914, 929, 428/113, 297.7, 298.1, 298.7, 299.1, 299.4

See application file for complete search history.

(56) References Cited

U.S. PATENT DOCUMENTS

| 3,485,706 | A | | 12/1969 | Evans |
| 4,209,215 | A | * | 6/1980 | Verma ............................ 439/497 |
| 4,310,365 | A | * | 1/1982 | Elliott et al. ..................... 156/55 |
| 4,822,663 | A | | 4/1989 | Reott |
| 4,875,644 | A | * | 10/1989 | Adams et al. ............... 244/134 R |
| 5,030,495 | A | * | 7/1991 | Neu ................................. 428/76 |
| 5,228,032 | A | | 7/1993 | Mertelmeier et al. |

(Continued)

FOREIGN PATENT DOCUMENTS

| DE | 10020651 | 11/2000 |
| GB | 559322 | 2/1944 |

(Continued)

OTHER PUBLICATIONS

E.R. Post, et al., *E-broidery: Design and Fabrication of Textile-Based Computing* (2000), vol. 39, Nos. 3 and 4, IBM Systems Journal.

*Primary Examiner* — Scott W Dodds
(74) *Attorney, Agent, or Firm* — Novak Druce Connolly Bove + Quigg LLP

(57) ABSTRACT

The invention provides a functional laminate composite fabric which is robust, laundry-durable and adaptable for securing about any three dimensional body, and a method for forming such fabric. The functional laminate fabric is provided with at least one functional element which can conduct electricity, conduct light, provide electromagnetic fields or provide shielding from electromagnetic fields. The functional laminate may include vias through which the functional element may be exposed. Generally, the functional laminate fabric is sufficiently robust for incorporation into garments and for applications in so-called wearable electronics.

12 Claims, 6 Drawing Sheets

(56) References Cited

U.S. PATENT DOCUMENTS

| | | |
|---|---|---|
| 5,268,981 A * | 12/1993 | Shahid .............................. 385/71 |
| 5,543,012 A | 8/1996 | Watson et al. |
| 5,611,017 A * | 3/1997 | Lee et al. ....................... 385/114 |
| 5,906,004 A | 5/1999 | Lebby et al. |
| 6,210,771 B1 | 4/2001 | Post et al. |
| 6,315,009 B1 | 11/2001 | Jayaraman et al. |
| 6,341,504 B1 | 1/2002 | Istook |
| 6,381,482 B1 | 4/2002 | Jayaraman et al. |
| 6,687,523 B1 | 2/2004 | Jayaramen et al. |
| 2001/0001300 A1 | 5/2001 | Tolbert et al. |
| 2001/0019050 A1 | 9/2001 | Rock et al. |
| 2001/0029142 A1 | 10/2001 | Martin |
| 2002/0086204 A1 | 7/2002 | Rock et al. |
| 2004/0127132 A1 | 7/2004 | Berman et al. |
| 2005/0061802 A1 | 3/2005 | Rock |
| 2005/0201697 A1 * | 9/2005 | Tanaka et al. .................. 385/114 |

FOREIGN PATENT DOCUMENTS

| | | |
|---|---|---|
| GB | 2170680 | 8/1986 |
| GB | 2261290 | 5/1993 |
| JP | 61-176200 | 8/1986 |
| JP | 62-51111 | 9/1994 |
| JP | 3007372 A | 2/1995 |
| JP | 11-339501 | 12/1999 |
| WO | WO-9964657 | 12/1999 |
| WO | WO-0020202 | 4/2000 |
| WO | WO-0245946 | 6/2002 |
| WO | WO-03087451 A2 | 10/2003 |

* cited by examiner

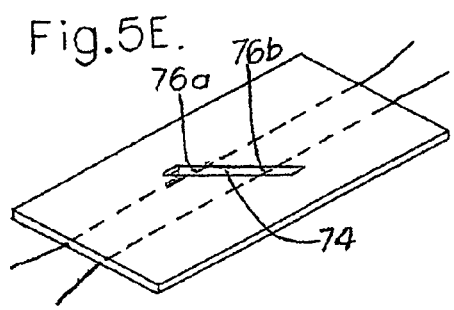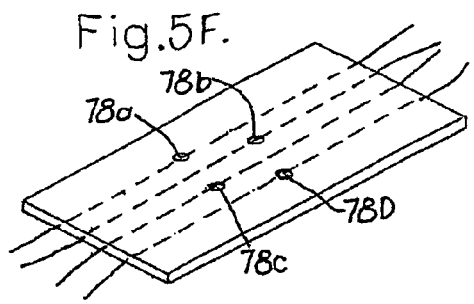

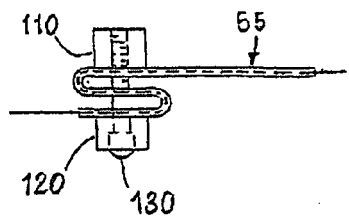
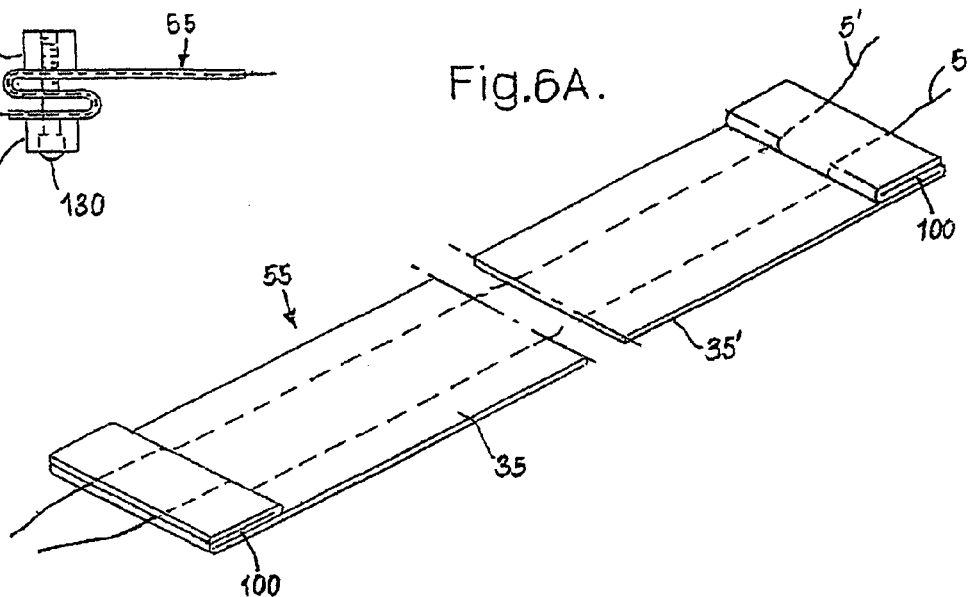

FUNCTIONAL TEXTILE STRUCTURES

CROSS-REFERENCE TO RELATED APPLICATION

This application is a divisional of U.S. application Ser. No. 11/570,310, filed Dec. 8, 2006, which was a national stage entry of PCT/IB2005/001679, filed Jun. 15, 2005, which claimed priority from U.S. Provisional Application No. 60/581,048, filed Jun. 18, 2004.

FIELD OF THE INVENTION

The present invention relates to flexible textile structures, adapted for securing about a three dimensional object, having the ability to conduct electricity, conduct light, and provide or influence electromagnetic fields.

BACKGROUND OF THE INVENTION

Different types of flexible textile structures having an ability to conduct electricity or to influence electromagnetic fields have been disclosed for certain medical and physiological monitoring applications. For example PCT publication WO 2003/087451A2 to Vikram Sharma ("Sharma") discloses a tubular knit fabric system comprising an electrically insulating yarn, a stretch yarn, and a "functional" yarn knitted together to form a tubular knit fabric. In Sharma, the functional yarn is electrically conductive, having a resistance of 0.01 ohm/meter to 5000 ohm/meter. The "functional" yarn is embedded within the tubular knit in a continuous spiral that extends the length of a sleeve formed from the tubular knit. Body portions, such as limbs, are surrounded by a portion of the tubular fabric to measure physiological signs. In addition, these tubular knit fabrics disclosed by Sharma are adaptable for use in a narrow elastic band configuration in which the functional yarns serve as parallel conductors for electrical signals. A disadvantage of Sharma's narrow elastic band structures is that the functional yarns or wires must be knitted simultaneously into the structure with all other components.

In addition to electrically conducting elements, optical fibers for light conduction have been disclosed for incorporation into garments. For example, U.S. Pat. No. 6,315,009 to Sundaresan Jayaraman et al. (assigned to Georgia Tech Research Corp.) ("Jayaraman") discloses a full-fashioned continuously woven garment consisting of a comfort component and sensing component of the base fabric. According to Jayaraman, the sensing component can be an electrically conductive component or a penetration sensing component. For example, the penetration sensing component can be an optical conductor such as plastic optical fiber. A disadvantage of the Jayaraman construction is the need to simultaneously weave directly into the tubular fabric or garment the elastic yarn and the functional component(s), e.g. plastic optical fiber.

The above references incorporate functional components, such as electrical conductors, through the use of fabric structures of a woven or knitted type. Such functional components can have poor compatibility with conventional textiles. Moreover, such functional components generally cause difficulties in conventional fabric forming processes (e.g. weaving, knitting, seamless knitting). For example, wires, small cables, and plastic optical fibers often match poorly with typical textile fibers because of their fragility, elastic modulus, extensibility, and tensile strength. In particular, such disadvantages are notable where elastic recovery and flexibility from the structure or garment is desired and where the ability to wash or launder a garment is desired. Thus, flexible textile structures are needed that can overcome one or more deficiencies of the prior art.

The art continues to seek structures with elements able to conduct electricity, conduct light, or influence electromagnetic fields for use in certain medical and/or physiological monitoring applications, as well as industrial and interconnect applications, wherein the structures do not have at least one of the deficiencies mentioned above. An ability to provide a launderable garment that incorporates functional elements into flexible textile-like structures without the need to knit or weave such elements would be highly desirable.

SUMMARY OF THE INVENTION

The present invention relates to a functional laminate with a substantially flat appearance. The functional laminate includes: first and second outer layers of a fabric, paper or film; at least one functional element coextending with the first and second outer layers of the fabric or film; and an adhesive composition for bonding the functional element between the outer layers. The functional laminate of the invention can be conductive, and can, for example, conduct electricity, conduct light, or provide an electromagnetic field. In one embodiment, a portion of the at least one functional element can be exposed through at least one hole or via provided in the laminate.

The present invention further relates to a method for preparing a functional laminate with a substantially flat appearance. The method includes: providing a length of a first piece of inextensible material having a first surface and a second surface; extending and fixing at least one length of a functional element coextensively with the inextensible material, and securing the extended length of the functional element to the first surface of said first piece of inextensible material along a substantial portion of the fixed length thereof; providing a second piece of inextensible material having a first surface and second surface, and securing said second piece of inextensible material either to the functional element or to the first surface of said first piece of inextensible material along a substantial portion of the length thereof coextending with said functional element to form the functional laminate. In one embodiment, the method further includes forming a via in the functional laminate such that a portion of the functional element is exposed through said via.

BRIEF DESCRIPTION OF THE DRAWINGS

The present invention will be described in the following detailed description with reference to the following drawings:

FIGS. 5E and 5F are perspective views of functional laminates wherein portions of the functional elements are exposed through vias or holes in the laminate; in FIG. 5E functional elements are exposed through an elongated slot-shaped perforation and in FIG. 5F four functional elements are exposed through individual perforation holes;

FIG. 6A is a perspective view of a functional laminate of the invention in which z-folds are formed at each end to stabilize the functional element within the laminate; and FIG. 6B is a cross-sectional view in side elevation of a clamping engagement to provide one possible electrical connection means at the z-fold formed at one end of the functional laminate of FIG. 6A.

DETAILED DESCRIPTION OF THE INVENTION

Figure 1:
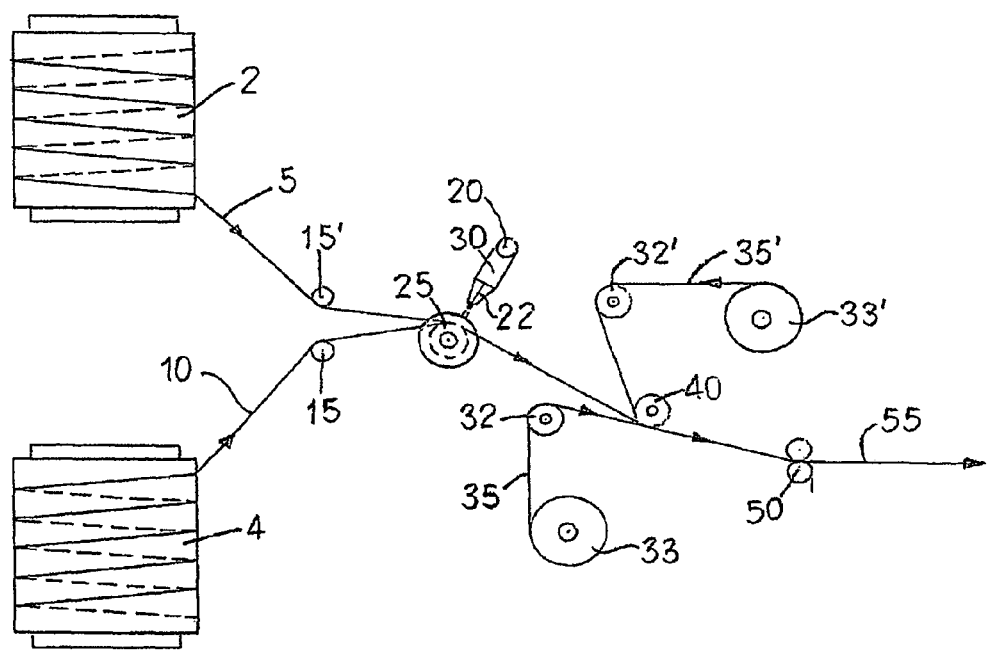
FIG. 1 is a schematic representation in side elevation of an apparatus suitable for making a functional laminate of the invention.

The invention includes a functional laminate that may be a composite fabric with a substantially flat surface appearance. The laminate can be conductive, robust, laundry-durable, and adapted for securing about any three dimensional body.

The functional laminate of the invention generally includes:

(a) first and second outer layers of nonwoven, knitted, or woven fabric, paper or film, wherein each layer has an inside (or first) surface and an outside (or second) surface with respect to the composite fabric;

(b) at least one functional element sandwiched between the outer layers; and (c) an adhesive composition for bonding the first and second outer layers, or for bonding the first and second outer layers to the functional element.

The two outer layers of nonwoven, knitted, or woven fabric, paper or film can, in one embodiment, be of substantially equal width.

In addition, the adhesive composition can, in one embodiment, comprise between about 8 and 70% of the laminate by weight, and although applied to only partially cover the inside surface of at least one outer layer, such adhesive may penetrate to the outside of each outer layer to an extent less than about 10%, based on the surface area of each outer layer.

Further, the functional element can be substantially parallel or coextensive with at least one other functional element.

In addition, the functional laminate can be provided with at least one hole or via, which allows for the exposure of at least one functional element.

The invention further provides a method for making a functional laminate, which includes the steps of:

providing a length of a first piece of inextensible material having a first surface and a second surface;

extending and fixing at least one length of a functional element coextensively with the inextensible material, and securing the extended length of the functional element to the first surface of said first piece of inextensible material along a substantial portion of the fixed length thereof;

providing a second piece of inextensible material having a first surface and second surface, and securing said second piece of inextensible material either to the functional element or to the first surface of said first piece of inextensible material along a substantial portion of the length thereof coextending with said functional element to form the functional laminate. Optionally, one or more perforations or holes are provided in the functional laminate that serve as one or more vias to expose the functional element. This method may further comprise the step of attaching at least one connector to the functional laminate, wherein said connector is adaptable for connecting the at least one functional element in the laminate to a source selected from the group consisting of electricity and radiation. Radiation may be photonic radiation selected from those wavelengths of light employed in fiber optic networks for data communication.

In one embodiment of the inventive method, the outer layers are substantially planarized and secured in place when the at least one functional element is secured to such layers. As used herein, the term "planarizing" means to bring a portion of a fabric, a web, or a film into a substantially planar and unwrinkled configuration without puckers.

As used herein, suitable "substantially inextensible materials" include nonwoven fabrics, woven fabrics, knit fabrics, papers, oriented and unoriented films, including variants of the foregoing with metallic coatings. These woven, nonwoven, and knit fabrics may comprise staple or continuous fibers, including those fibers from polyolefins, polyesters, polyamides, and polyperfluorinated olefins. Suitable films may comprise polymers, including polyester, polyolefins, polyperfluorinated olefins, and polyamides. The fabrics or films of the outer layers of the functional laminate can include any of the above-mentioned substantially inextensible materials.

As used herein, the term "functional" means elements or materials that exhibit electrical, optical, magnetic, mechanical, chemical, and/or thermal energy properties.

Examples of "functional materials" include, but are not limited to, materials that present: electrical function (e.g., electrical conductivity, heating, piezoelectric, electrostrictive, electrochromic activity); optical function (e.g., photonic crystal fibers, photoluminesce, luminescence, light transmission, reflection); magnetic function (e.g., magnetostrictive activity); thermoresponsive function (e.g., shape memory polymers or alloys); and sensorial function (e.g., chemical, bio, capacitive). Such functional materials can be included in functional elements used in embodiments of the present invention.

As used herein, suitable "functional elements" include: metallic wires of the insulated or noninsulated variety, having one or more conductors, such as litz wire, tinsel wire, or stranded conductors for high frequency use; single stranded metallic wires having circular or noncircular cross-sections, such as, ribbon wire; metallic coated polymeric wires and films, such as, Xstatic® yarns and metallized MYLAR® (from DuPont-Teijin Films, Hopewell, Va., USA); inherently conductive polymer fibers such as those from polypyrrole; plastic optical fiber from polymethyl methacrylate, such as, CROFON®; and silica glass optical fibers of the multi-mode or single-mode variety suitable for fiber optic networks based on Ethernet, Fiber Channel, FDDI, ATM and Token Ring protocols. Suitable functional elements also include the conductive stretchable composite yarns disclosed in PCT publication WO 2004/097089 A1, the entire disclosure of which is incorporated herein by reference (hereinafter referred to as "electrically conductive composite yarns that comprise an elastic member surrounded by at least one conductive covering filament"); as well as the elastomeric compositions disclosed in U.S. Provisional No. 60/562,622, filed Apr. 15, 2004, the entire disclosure of which is incorporated herein by reference (hereinafter referred to as "electrically conductive elastomeric compositions that exhibit variable resistance").

As used herein, the term "adapted for securing about any three dimensional body" means the functional laminate is flexible allowing conformance to any shape. Particularly, where the functional laminate is a garment or a component of a garment or other wearable placed on at least a portion of a body, the laminate is at least as adaptable as the garment or wearable in conforming to the three dimensional shape of the body. Inherent in the adaptable conformance of the laminate to any three dimensional body is a robustness of the laminate structure to maintain the performance of the laminate's functional element in the presence of any motion of the three dimensional shape to which the laminate is conforming.

As used herein, the term "laundry durable" means the functional laminate is at least washable. Particularly, where the functional laminate is a component of a washable garment or other washable wearable placed on the body, the laminate structure maintains the performance of the laminate's functional element after multiple washing or laundry cycles. For example, maintaining functional element performance after at least one wash cycle would be "laundry durable."

As used herein, the term "conductive" means at least a portion of the laminate conducts electricity, conducts light, or is able in provide an electromagnetic field, or is able to provide shielding from electromagnetic fields.

As used herein, the term "substantially parallel or coextensive" means that the functional element(s) extend lengthwise in the same direction of the functional laminate (also known as the "machine direction") without contacting an adjacent functional element. Such substantially parallel or coextensive elements can be, in at least one embodiment, substantially equidistant from the other functional elements(s) along their length in the direction perpendicular to the direction in which they extend. For example, when a functional element extends in the machine direction of the functional laminate, then another substantially parallel or coextensive functional element also extends in the machine direction, and both elements are substantially equidistant from each other in the direction perpendicular to the machine direction at points along their length. Nonwoven fabrics suitable for making functional laminates of the invention can have a basis weight ranging from about 10 to about 100 grams/(meter)$^2$, such as from about 10 to about 30 grams/(meter)$^2$. Many types of nonwoven fabrics are suitable for use in embodiments of this invention. Representative examples include nonwovens composed of thermally bonded, spunbonded, and hydroentangled fibers. For example, they may be composed of synthetic polymeric fibers such as polyolefin, polyester, and polyamide fibers.

The functional laminate of the invention comprises a middle "layer" of at least one functional element sandwiched between the outer layers of inextensible material, such as nonwoven fabrics or films.

The functional element(s) in this middle "layer" may, in one embodiment, be a metallic wire of the insulated or uninsulated variety. For example, single conductor wire may be used. The use of more conductors per wire, such as litz wire or stranded conductors, is suitable for high frequency electrical use. A single stranded metallic wire having a circular or noncircular cross-section, such as ribbon wire, is suitable for high currents or where a more rigid laminate is preferred. In addition, flat metallic wires, may be used such as the flat copper wire (insulated or non-insulated) from REA Magnet Wire Co., Fort Wayne, Ind. Certain metallic coated polymeric fibers may also be used, such as, Xstatic® yarns, which are silver plated textile nylon filaments available from Laird Sauquoit Technologies, Inc. (300 Palm Street, Scranton, Pa., 18505) under the trademark X-static yarn. One suitable form of X-Static® yarn is based upon a 70 denier (77 dtex), 34 filament textured nylon available from INVISTA S. à r. l., Wilmington, Del. as product ID 70-XS-34×2 TEX 5Z electroplated with electrically conductive silver. Another suitable conductive yarn is a metal coated KEVLAR® yarn known as ARACON® from E.I. DuPont de Nemours, Inc., Wilmington, Del. Also useful in embodiments of the invention are members of the class of inherently conductive polymer fibers, such as those from polypyrrole. In addition, the plastic optical fiber (POF) from polymethyl methacrylate polymers may be used. Where a functional element for guiding light is desired, a POF, such as CROFON® may be used. Useful POF may, for example, be of the step-index type (SI-POF) or the graded index type (GRIN-POF) for higher speed optical communications. The class of silica glass optical fibers of either the multi-mode or single-mode variety also comprise a useful class of functional elements suitable for fiber optic networks based on Ethernet, Fiber Channel, FDDI, ATM, and Token Ring protocols.

In addition, the functional element can comprise a conductive yarn, such as of Xstatic® yarn or fiber twisted together with wire, for example, copper wire. The functional element can further comprise electrically or optically functional composite yarns that comprise an elastic member surrounded by at least one functional covering filament or electrically conductive elastomeric compositions that exhibit variable resistance twisted together with Spandex and/or Xstatic® yarn.

The layers of the functional laminate are bonded together by an adhesive composition. Each element in the composite should be bonded to at least one other element of the composite. For example, an adhesive may be applied to the functional element, and in turn that element may be adhered to inner surfaces of the outer layers. As another example, an adhesive may be applied to an inner surface of one of the outer layers. The adhesive composition can, for example, constitute from about 8% to 70% of the weight of the composite fabric. Adhesive content in the functional laminate above these levels may, in certain circumstances, be disadvantageous, as the fabric may bond to itself. Suitable adhesive compositions can, for example, be hot melt adhesives, such as styrene-based block copolymers, including styrene/isoprene and styrene/butadiene block copolymers. Bonding by other methods may be possible, such as flame lamination and laser or ultrasonic welding, if such techniques can be carried out without harming the functional element.

The number of functional elements per inch of width of laminate material is not limited and can, for example, range from 1 to 20, such as from 5 to 10.

Figure 2:
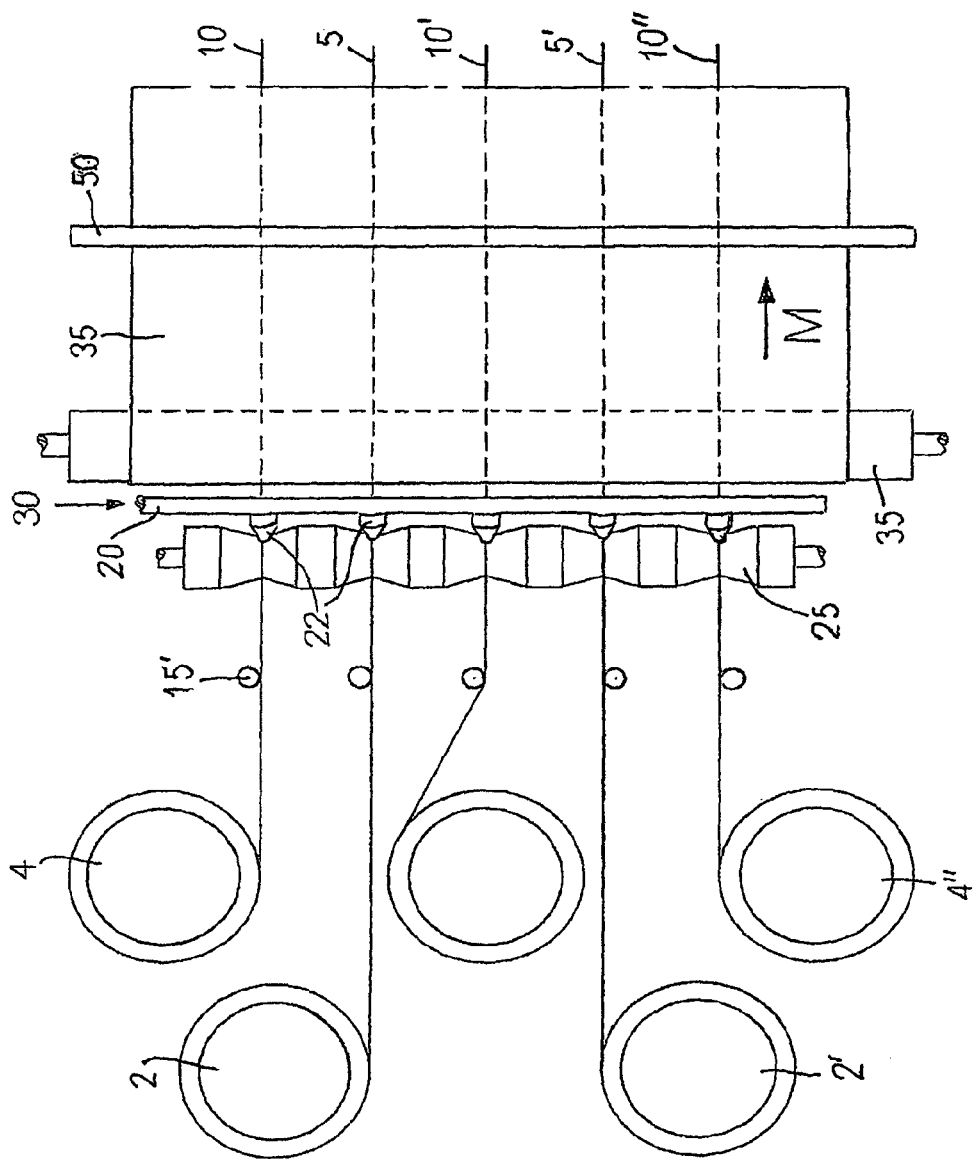
FIG. 2 is a schematic representation in top plan view of a portion of an apparatus for making a functional laminate of the invention.
Figure 4:
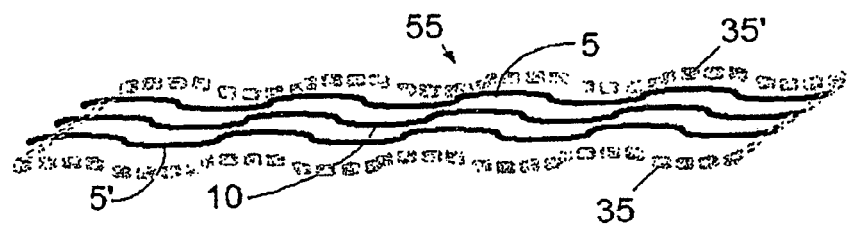
FIG. 4 is a schematic representation of an edge sectional view of a functional laminate of the invention.

The apparatus schematically represented in side elevation in FIG. 1 may be used in the process of making functional laminates falling within the scope of the present invention. FIG. 1 shows supply rolls 2 and 4 of functional elements 5 and 10 (copper wire, for example). However, a plurality of supply rolls and functional elements is also contemplated (see, for example, FIG. 2, which shows supply rolls 2, 2', 4, 4', and 4" of functional element 5, 5', 10, 10', and 10"). A functional element can, for example, be uniformly tensioned between roll 15 and nip rolls 50 (or roll 15' and nip rolls 50) to provide stability, but generally such functional elements 5 and 10 are not substantially elongated. In FIG. 1, the functional elements 5 and 10 are shown as being side-by-side and may be separated on any pitch over the roll surface of guide plate 25. Where multiple functional elements are supplied to the process (see FIG. 2 where the machine direction, M, of the process is indicated), it is understood that the guide plate 25 (in FIGS. 1 and 2) or an equivalent spacing means can provide the position and pitch of each functional element. In FIG. 1, a layer of substantially parallel functional elements 5 and 10, are shown as being placed on top of one of the layers of nonwoven fabric 35 supplied from rolls 33. An adhesive 30, for example, a hot melt adhesive, is applied onto the functional elements and bottom nonwoven layer via conduit 20. The other layer of nonwoven 35', supplied from rolls 33', is then placed on top of the adhesive-treated combination at roll 40 and the combined structure is bonded by heat and pressure at nip rolls 50. Alternatively, the adhesive 30 can be applied to the functional elements prior to their placement between layers of nonwoven fabric. When the bonding is completed, the uniform tension is substantially completely released and the composite fabric relaxes to form the desired structure 55. Arrow D indicates direction of travel of the produced structures 55 away from the nip rolls 50.

The hot melt adhesive 30 (see, for example, FIG. 2) can be applied in several different ways. In one method, the melted adhesive can be deposited as a discontinuous web from a spray nozzle (one such nozzle 22 is shown at the end of adhesive conduit 20 in FIG. 2), by a process known as melt blowing. In another method, the melted adhesive can be deposited as a solid stream from a nozzle that moves in a spiral pattern as the web passes, by a process known as spiral spray. A pattern in which the adhesive only partially covers the non-woven layers, such as is produced by melt-blowing or spiral spray, can result in a uniform, flat surface appearance of the composite fabric. By "only partially covers" it is meant that the adhesive is present at one part of the nonwoven but absent at an adjacent part. This can also be accomplished by applying a "dot matrix" pattern.

Figure 3A:
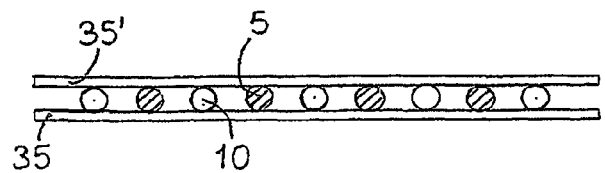
FIGS. 3A and 3B are schematic representations in cross-section of a functional laminate of the invention, illustrating a sandwich of functional elements between two fabrics or sheets of other inextensible material.
Figure 3B:
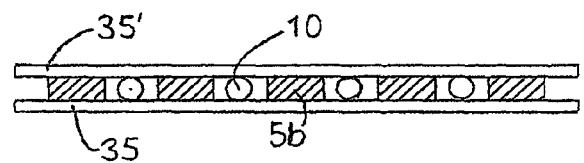

FIG. 3A and FIG. 3B illustrate functional laminate structures with different functional elements 5 and 5b. In FIG. 3A, functional element 5 is a copper wire. In FIG. 3B, functional element 5b is ribbon wire. In FIGS. 3A and 3B, nonwoven fabrics 35 and 35' are as described for FIGS. 1 and 2.

The functional laminate may be "laundry durable" meaning that it can undergo at least one laundry cycle without showing evidence of delamination of the outer layers (whether polypropylene or polyester fiber-based nonwovens), which would indicate loss of bonding between the functional element(s) and the outer layers. The functional laminate may also be disposable, for example, when at least one of the outer layers comprises paper.

The functional laminate fabric may, in certain embodiments, be further characterized by laundry durability such that it can undergo at least about 28 laundry cycles without showing evidence of delamination of the outer layers. To demonstrate such durability, the following laundry cycle is used: 30-minute warm wash/warm rinse with 38-41° C. (100-105° F.) water and 50 g of "Tide" detergent in a Sears Kenmore Series 80 washer, followed by drying on the "normal/permanent press/medium" setting (up to 96° C. (205° F.)) in a Sears Kenmore Series 80 dryer.

The laundry durability of these functional laminate fabrics can be provided by using selected adhesives having a complex viscosity at 120° C. of: (i) at least about 25 pascal seconds (250 poise) when the outer layers comprise nonwoven fabric that comprises polypropylene fibers; and (ii) at least about 200 pascal seconds (2,000 poise) when the outer layers comprise nonwoven fabric that comprises polyester fibers.

The absolute value of the complex viscosity is defined as follows: At a given frequency, $\omega$, and shear stress, $\sigma$, the absolute value of the complex viscosity, $|\eta^*|$, is the square root of the sum of the squares of the elastic, ($G'$), and viscous, ($G''$), moduli divided by the frequency:

$$|\eta^*|=\sqrt{G'^2+G''^2}/\omega$$

The softening point of useful adhesives can generally be expected to exceed 90° C. (194° F.) and suitably can generally be expected to exceed 110° C. (230° F.).

Examples of adhesives useful in making laundry durable functional laminate fabrics include those that contain styrene-based block copolymers, which may also contain additives, such as tackifying agents and processing oils. Where the nonwoven fabrics comprise polypropylene fibers, the adhesives can include HL-1486 and HL-1470 (H. B. Fuller Company), and H-2104, H-2494, and H-2385 (Bostick, Inc., Milwaukee, Wis.). Where the nonwoven fabrics comprise polyester and/or polypropylene fibers, the adhesives can include H-2385 (Bostick, Inc., Milwaukee, Wis.) and NS-34-3260, NS-34-3322, and NS-34-5640 (National Starch Company). All of the above-named adhesives contain styrene-based block copolymers. The complex viscosity of selected adhesives that are useful in making the laundry-durable functional laminate fabrics of the invention are disclosed in EP1 128 952 B1 (granted 20031126 and assigned to E.I. DuPont de Nemours and Co.), the entire disclosure of which is incorporated herein by reference.

Figure 5A:
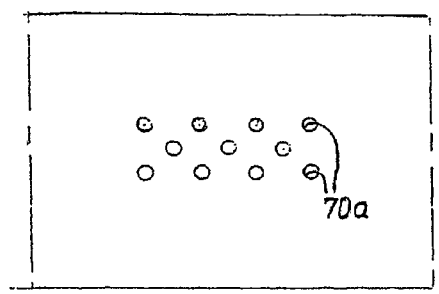
FIGS. 5A-5D are top plan views of perforation patterns that may be used to form perforations in an outer sheet of the composite laminate to expose functional elements.
Figure 5B:
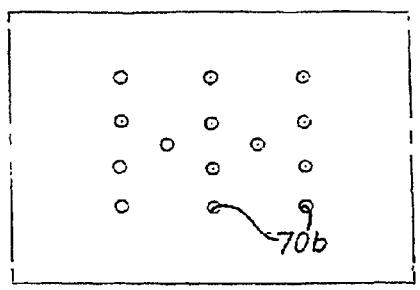
Figure 5C:
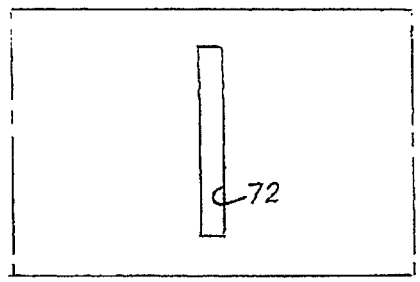
Figure 5D:
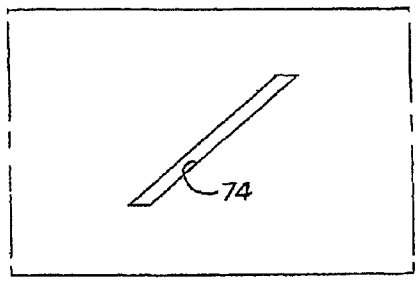

FIGS. 5A through 5D are top plan views of perforation patterns that may be used in conjunction with the invention. In FIG. 5A, a series of eleven round hole perforations 70a are formed in a regular grid pattern. In FIG. 5B, a series of fourteen round hole perforations 70b are formed an alternate regular grid pattern. In FIG. 5C, a rectangular slot perforation 72 is shown, oriented with its longest side generally perpendicular to the lengthwise-extension of the sheet holding such pattern and thus generally perpendicular to the extended length of the functional element. In FIG. 5D, a trapezoidal slot perforation 74 is shown, oriented at a slant with respect to the lengthwise extension of the sheet holding such pattern. The pattern sheets in FIGS. 5A to 5D are representative of the types of patterns that may be employed. Other advantageous patterns may be designed to meet specific requirements. Preferably, the patterns are cut through one outer layer of the functional laminate, either while the layer is held in a planarized and fixed position or prior to assembling such layer within the functional laminate. Optionally, such patterns may be cut through both outer layers of the functional laminate.

FIGS. 5E and 5F are perspective views of functional laminates wherein portions of the functional elements are exposed through vias or holes in one outer layer of the laminate. In FIG. 5E, functional elements, 76a and 76b, are exposed through an elongated slot-shaped perforation 74. In FIG. 5F, four functional elements, 78a, 78b, 78c, and 78d, are shown each exposed through an individual perforation hole.

FIG. 6A is a perspective view of a functional laminate 55 of the invention comprised of two nonwoven fabrics, 35 and 35', and having two functional elements, 5 and 5', and including a folded over portion 100 or z-fold at each end. The folded over portion 100 functions as a strain relief, to help maintain the functional elements within the laminate structure.

The folded over portion 100 also permits a connector means to be clamped about the folded over portion. In FIG. 6B, an end portion of a laminate is represented in cross-section includes a clamping means comprising a first portion 110 and a second portion 120. The first portion 110 of the clamping means is provided with at least a pair of threaded holes each adapted to receive the threads of a bolt 130, which passes through the second portion of the clamping means 120 and engages the threads of portion 110. In FIG. 6B, the two portions of the clamping means 120 and 110' represented in cross-section, are completely engaged by means of the threaded bolts and provide a tight clamping of the folded over portion of laminate 55.

The invention is further illustrated in view of the Examples below.

EXAMPLES

The samples in these examples were made using a nonwoven fabric from Table 1 and a functional or conductive element from Table 2.

TABLE 1

Nonwoven Fabric Used

| Id | Description | Supplier |
|---|---|---|
| NW1 | Ahlstrom 50 gsm wet laid Polypropylene | Invista |
| NW2 | Avgol 15 gsm spunbonded Polypropylene | Perkin Sales, Inc., Edisto Island, SC 29438, USA |
| NW3 | Ahlstrom 62 gsm wet laid polypropylene | Invista |
| NW4 | SMS PP 30 gsm | Bostik Inc., Milwaukee, WI, USA |
| NW5 | SMS PP 15 gsm | Bostik Inc., Milwaukee, WI, USA |
| NW6 | Avgol 50 gsm spunbonded Polypropylene | Perkin Sales, Inc., Edisto Island, SC 29438, USA |

TABLE 2

Functional or Conductive Element Used

| ID | Description | Manufacturer |
|---|---|---|
| Cu1 | Copper flat wire 0.05" × 0.003" tin plated | Rea Magnet Wire, Inc., Fort Wayne, Indiana, USA |
| Cu2 | Copper flat wire 0.058" × 0.003" insulated with polyester | Rea Magnet Wire, Inc., Fort Wayne, Indiana, USA |
| Cu3 | Copper flat wire 0.05" × 0.003" with polyester insulation | Rea Magnet Wire, Inc., Fort Wayne, Indiana, USA |
| XCu1 | Twisted Xstatic ® 8ply 70f34 Tex Non-HS with two 36awg Silver coated Cu wires | Produced in-house with commercially available yarns/wires |
| Xs1 | Xstatic ® silver coated nylon 8ply 70f34 Tex non-HS | Sauquiot Industries Inc., Scranton, PA USA |
| Xs2 | Xstatic ® silver coated nylon 8ply 70f34 Flat HS (2 hr 190 F.) | Sauquiot Industries Inc., Scranton, PA USA |

Each of the test samples was washed as described below and the electrical resistance or conductivity was measured in the manner known to those skilled in the art of electrical measurement. The wash durability testing method was comprised of a machine wash cycle with warm (40° C.) water and a cold rinse (room temperature water) using American Association of Textile Chemists and Colorists (AATCC) WOB Standard Powder Detergent with a hanging to dryness phase at room temperature.

Example 1

In the examples shown in Table 3, a 2 to 5 inch (5.1 to 12.7 cm) wide functional laminate was prepared using the apparatus schematically represented in FIG. 1. The laminate had functional elements as shown in Table 3 and described in Table 2. The functional elements were supplied from rolls under tension to the apparatus illustrated in FIG. 1. A pitch of 0.1 inch to 0.2 inch (2.5 to 5.8 mm) was used, as shown in Table 3, for different examples. The two layers of nonwoven fabric were supplied by rolls to the apparatus shown in FIG. 1 (see, for example, the rolls 33 and 33') under sufficient tension to effectively planarize the two nonwoven fabrics. Typically, the conductive element was introduced into the structure before the adhesive was introduced. However, as indicated in Table 3, the adhesive was also introduced, in some samples, before the conductive element.

For all samples, the adhesive was melt blown just before contacting the bottom layer of nonwoven fabric. For all samples, a styrene/isoprene block copolymer-based adhesive was used (product of Bostik Inc., Wawatosa, Wis., USA), at different rates, as shown in Table 3. The adhesive was applied at 149° C. The speed of the samples entering a pair of nip rollers (substantially the same as schematically represented by nip rolls 50 in FIG. 1) varied from 50 ft/min to 200 ft/min (15.2 to 61.0 m/min), as shown in Table 3, using an adequate nip roll pressure. The top and bottom layers of nonwoven fabric and conductive filaments became adhesively bonded by this process.

Table 3 shows the electrical resistance data (in Ohms/meter) for 50 cm length samples after being subjected to the number of wash cycles indicated. As can be seen from the Table, wash testing of the samples showed no profound change in DC electrical resistance for each individual conductive element, other than a small increase to less two times the before washing resistance.

TABLE 3

Electrical Resistance (Ohms/meter)

| Sample ID | Nonwoven Id & gsm | Adhesive Type & mg/sqin | Wire Id | Pitch | 0 washes | 5 washes | 10 washes | 15 washes | 20 washes | 25 washes |
|---|---|---|---|---|---|---|---|---|---|---|
| 0504084 | NW3 - 62 gsm | H-2766 | Cu1 | 0.20 in. | 0.2 | 0.2 | 0.4 | Broke | | |
| | NW3 - 62 gsm | 10 mg/in² | Cu1 | | 0.3 | 0.2 | Broke | Broke | | |
| | | | Cu1 | | 0.2 | 0.5 | Broke | Broke | | |
| 050427-1 | NW1 - 50 gsm | H-2766 | Cu1 | 0.10 in. | 0.3 | 0.4 | Broke | Broke | | |
| | NW1 - 50 gsm | | Cu1 | | 0.4 | 0.5 | Broke | Broke | | |
| | | | Xs1 | | 56 | 60 | 58 | 62 | | |
| | | | Xs1 | | 58 | 68 | 60 | 63 | | |
| 050427-2 | NW1 - 50 gsm | H-2766 | Cu1 | 0.10 in. | 0.4 | 0.4 | Broke | Broke | | |
| | NW2 - 15 gsm | 12 mg/in² glue | Cu1 | | 0.4 | 0.5 | Broke | Broke | | |
| | | | Xs1 | | 56 | 68.6 | 54 | 60 | | |
| | | | Xs1 | | 57 | 65.4 | 64 | 70 | | |
| | | | Xs1 | | 52 | 58.6 | 66 | 71 | | |
| | | | Xs1 | | 56 | 65.4 | 64 | 68 | | |
| 050427-3 | NW3 - 62 gsm | H-2766 | Cu1 | 0.10 in. | 0.4 | 0.4 | Broke | Broke | | |
| | | 22 mg/in² glue | Xs1 | | 53 | 60 | 64 | 68 | | |
| | | | Xs1 | | 55 | 66 | 66 | 69 | | |
| | | | Xs1 | | 54 | 66 | 64 | 67 | | |
| 050503-1 | NW2 - 15 gsm | H-2766 | XCu1 | 0.1 in | 0.8 | 0.9 | 1.1 | 10.3 | 25.4 | |
| | NW2 - 15 gsm | | XCu1 | | 0.8 | 0.9 | 1.1 | 15.4 | 28.3 | |
| | | | Xs1 | | 50 | 58 | 62 | 65 | 78 | |
| | | | Xs1 | | 54 | 59 | 65 | 70 | 80 | |

TABLE 3-continued

| | | | | Electrical Resistance (Ohms/meter) | | | | | |
|---|---|---|---|---|---|---|---|---|---|
| Sample ID | Non-woven Id & gsm | Adhesive Type & mg/sqin | Wire Id | Pitch | 0 washes | 5 washes | 10 washes | 15 washes | 20 washes | 25 washes |
| 050503-2 | NW1 - 50 gsm | H-2766 | Cu2 | 0.10 in. | 0.2 | 0.3 | 0.2 | 0.3 | 0.3 | |
| | NW1 - 50 gsm | | Cu2 | | 0.3 | 0.4 | 0.3 | 0.4 | 0.2 | |
| | | | Xs1 | | 52 | 59 | 65 | 73 | 78 | |
| | | | Xs1 | | 53 | 61 | 68 | 75 | 79 | |
| 050518-1 | NW4 - 30 gsm | H-2385 | Cu3 | 0.10 in | 0.2 | 0.3 | 0.2 | 0.2 | | 0.2 |
| | NW4 - 30 gsm | 10 mg/in² | Cu3 | | 0.2 | 0.2 | 0.2 | 0.2 | | .03 |
| | 50 fpm | | Xs2 | | 51 | 54.8 | 68 | 84.6 | | 98.7 |
| | | | Xs2 | | 53.2 | 64.6 | 65 | 86.4 | | 97.6 |
| | | | Xs2 | | 54 | 61 | 66.2 | 84 | | 95.6 |
| | | | Xs2 | | 51 | 58.2 | 65.4 | 84.6 | | 94.8 |
| 050518-2 | NW4 - 30 gsm | H-2385 | Cu3 | 0.10 in. | 0.3 | 0.2 | 0.2 | 0.2 | | |
| | NW4 - 30 gsm | 20 mg/in² | Cu3 | | 0.2 | 0.3 | 0.3 | 0.2 | | 0.2 |
| | 50 fpm | | Xs2 | | 55 | 68.4 | 70 | 84.2 | | 0.3 |
| | 100 fpm | | Xs2 | | 53.2 | 64 | 72 | 78 | | 96.5 |
| | 200 fpm | | Xs2 | | 53 | 58 | 64.8 | 83.4 | | 96.4 |
| | | | Xs2 | | 53.4 | 59.2 | 68 | 82.4 | | 95.4 |
| 050519-3 | NW5 - 15 gsm | H-2385 | Cu3 | 0.10 in. | 0.2 | | 0.2 | | 0.2 | |
| | NW5 - 15 gsm | 20 mg/in² | Cu3 | | 0.2 | | 0.2 | | 0.3 | |
| | 50 fpm | adhesive applied after the yarn contact | Xs2 | | 54.6 | | 68 | | 74.6 | |
| | | | Xs2 | | 53.2 | | 66.8 | | 74.6 | |
| | | | Xs2 | | 53.8 | | 67.4 | | 78.2 | |
| | | | Xs2 | | 54.2 | | 66.5 | | 78.4 | |
| 050519-4 | NW5 - 15 gsm | H-2385 | Cu3 | 0.10 in. | 0.2 | | 0.2 | | 0.3 | |
| | NW5 - 15 gsm | 20 mg/in2 | Cu3 | | 0.2 | | 0.2 | | 0.3 | |
| | 50 fpm | adhesive applied before the yarn contact | Xs2 | | 54.6 | | 67.8 | | 72.4 | |
| | | | Xs2 | | 55.4 | | 69.3 | | 76.6 | |
| | | | Xs2 | | 52.6 | | 68.4 | | 76.4 | |
| | | | Xs2 | | 54.2 | | 65.8 | | 78.2 | |
| 050519-5 | NW6 - 50 gsm | 20 mg/in2 applied after functional elements | Cu3 | 0.10 in. | 0.2 | | 0.2 | | 0.2 | |
| | NW6 - 50 gsm | | Cu3 | | 0.0 | | 0.3 | | 0.2 | |
| | 50 fpm | | Xs2 | | 52.4 | | 68.5 | | 76.4 | |
| | | | Xs2 | | 54.6 | | 65.4 | | 76.8 | |
| | | | Xs2 | | 57.0 | | 64.3 | | 78.2 | |
| | | | Xs2 | | 55.2 | | 65.9 | | 74.8 | |

Example 2

This example provides a laminate that has at least one modified outer layer. As in previous examples, copper-based conductive elements, wires, ribbons, and/or metallic plated yarns can be introduced between two non-woven layers. The conductive element(s) are bonded between two layers of the nonwoven fabric with a hot melt adhesive. The two layers of nonwoven fabric are, as in Example 1, supplied on rolls (such as 33 and 33' in FIG. 1) under sufficient tension to effectively planarize the two nonwoven fabrics. The conductive elements (copper ribbons) are in a relaxed state under no tension and the adhesive is melt blown onto the bottom layer of nonwoven fabric.

In this example, perforations are provided in one of the outer layers at intervals along a path substantially co-linear with the one of the conductive elements, e.g. co-linear with at least one of the two copper ribbons. These perforations in the outer (nonwoven) layer are punctuated along the length of the nonwoven material. Such perforations are also known in the electrical and electronic arts as "vias" (vias are construed here to mean a through-passage communicating from one surface to another and through which a wire or functional element passes, so that the wire is underneath the via).

As shown in FIG. 5, the perforations can, for example, be geometric shaped rectangles or circular cross-sectionally shaped holes obtained by a "hole-punching" means. Any cross-sectional shape is generally suitable and is readily provided by a hole punch die having the desired shape. Hole-punching means can, for example, include a hand held device, which produces a single hole, and a 3-hole paper punch used to make 3-ring binder holes in paper. In general, such hole-punching means are used in a step-and-repeat fashion to make a series of holes of a fixed spacing interval in the non-woven.

Alternatively, the non-woven sheet may be fed through a dedicated hole punching apparatus capable of hole punching on a fixed spacing interval or on a randomly spaced interval selected by the operator. Alternately, the non-woven sheet may be scored. The non-woven sheet, so perforated, can be wound up in a conventional manner to then be mounted in an apparatus (such as that shown in FIG. 1, in either or both of positions denoted as 33 or 33'). In an alternative embodiment, vias can be cut in any shape directly into multiple layer depths of an un-wound roll. The perforated non-woven can then used to form a functional laminate.

Nothing in this specification should be considered as limiting the scope of the present invention. All examples presented are representative and non-limiting. The above described embodiments of the invention may be modified or varied, and elements added or omitted, without departing from the invention, as appreciated by persons skilled in the art in light of the above teachings. It is therefore to be understood that the invention is to be measured by the scope of the claims, and may be practiced in alternative manners to those which have been specifically described in the specification.

The invention claimed is:
1. A method for preparing a functional laminate with a substantially flat appearance, comprising:
   providing a length of a first piece of fabric having a first surface and a second surface;

perforating the first piece of fabric to form one or more predetermined via openings therethrough, each said via opening having a length and a width;

extending and fixing at least one length of a functional element coextensively with the first piece of fabric, wherein said functional element is selected from the group consisting of: insulated single and multi-stranded metallic wires, noninsulated single and multi-stranded metallic wires, metallic coated polymeric fibers, inherently conductive polymer fibers, optical fibers, plastic optical fibers, silica glass optical fibers, electrically conductive composite yarns, and metallic coated films;

securing the extended length of the functional element to the first surface of said first piece of fabric along a substantial portion of the fixed length thereof;

providing a length of a piece of having a first surface and second surface; and securing said piece of either to the functional element or to the first surface of said first piece of fabric along a substantial portion of the length thereof coextending with said functional element to form the functional laminate, wherein the width of said at least one via opening is at least as large or is larger than a diameter or width of the functional element, wherein the functional element does not penetrate into or through either of the first piece of fabric or the piece of inextensible material, and wherein at least a portion of the functional element is exposed to an environment external to the functional laminate through the at least one via.

2. The method of claim 1, wherein at least two lengths of functional elements are extended and fixed to be substantially parallel or coextensive.

3. The method of claim 1, wherein the fabric is selected from the group consisting of nonwoven fabric, woven fabric and knit fabric.

4. The method of claim 1, wherein the at least one via opening is selected from the group consisting of a hole, a slit or a slot.

5. The method of claim 4, further comprising perforating the piece of inextensible material to form at least one other via opening.

6. The method of claim 1, further comprising the steps of: (i) folding a distal end of the functional laminate back onto itself at least one time; and (ii) fastening such folded end to an outer surface of one outer layer.

7. The method of claim 6, wherein fastening is by a mechanical fastening mechanism selected from the group consisting of gluing, riveting, snapping, stitching, stapling, welding, and encasing.

8. The method of claim 1, further comprising the step of attaching at least one connector to the functional laminate, wherein said connector is adaptable for connecting the at least one functional element in the laminate to a source selected from the group consisting of electricity and radiation.

9. The method of claim 8, further comprising connecting a source of electricity to the at least one functional element.

10. The method of claim 8, further comprising connecting a source of radiation to the at least one functional element.

11. The method of claim 1, wherein the inextensible material is a fabric or film selected from the group consisting of: nonwoven fabric, woven fabric, knit fabric, paper and polymer film.

12. The method of claim 1, wherein the inextensible material is a fabric.

* * * * *

UNITED STATES PATENT AND TRADEMARK OFFICE
CERTIFICATE OF CORRECTION

PATENT NO. : 8,709,185 B2  
APPLICATION NO. : 12/345711  
DATED : April 29, 2014  
INVENTOR(S) : Qaizar Hassonjee et al.

Page 1 of 1

It is certified that error appears in the above-identified patent and that said Letters Patent is hereby corrected as shown below:

In the Claims

In Claim 1, column 13, line 16, after the text beginning "providing a length of a piece of" – insert: -- inextensible material -- and In Claim 1, column 13, line 18, after the text beginning "securing said piece of" – insert: -- inextensible material --.

Signed and Sealed this  
Fifth Day of August, 2014

Michelle K. Lee  
*Deputy Director of the United States Patent and Trademark Office*